US008390399B2

(12) United States Patent
Huang et al.

(10) Patent No.: US 8,390,399 B2
(45) Date of Patent: Mar. 5, 2013

(54) RESONATOR AND PERIODIC STRUCTURE

(75) Inventors: Tsun-Che Huang, Tainan (TW); Pin Chang, Hsinchu (TW); Feng-Chia Hsu, Gangshan Township, Kaohsiung County (TW); Chin-Hung Wang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 360 days.

(21) Appl. No.: 12/781,112

(22) Filed: May 17, 2010

(65) Prior Publication Data

US 2011/0128094 A1   Jun. 2, 2011

(30) Foreign Application Priority Data

Dec. 2, 2009 (TW) ................................ 98141263 A

(51) Int. Cl.
*H03H 9/05* (2006.01)
*H03H 9/24* (2006.01)
*H03H 9/46* (2006.01)
(52) U.S. Cl. ....................................... 333/186; 333/200
(58) Field of Classification Search .......... 333/186–189, 333/197–200
See application file for complete search history.

(56) References Cited

U.S. PATENT DOCUMENTS

| 6,628,177 | B2 | 9/2003 | Clark et al. | |
| 6,710,680 | B2 | 3/2004 | Niu et al. | |
| 6,861,914 | B2 * | 3/2005 | Photiadis et al. | 331/156 |
| 7,057,476 | B2 | 6/2006 | Hwu | |
| 7,295,088 | B2 | 11/2007 | Nguyen et al. | |
| 7,492,241 | B2 * | 2/2009 | Piazza et al. | 333/189 |
| 7,733,198 | B1 * | 6/2010 | Olsson et al. | 333/187 |
| 8,212,324 | B2 * | 7/2012 | Caruyer et al. | 257/415 |
| 2009/0289314 | A1 * | 11/2009 | Caruyer et al. | 257/416 |
| 2009/0295505 | A1 * | 12/2009 | Mohammadi et al. | 333/191 |
| 2010/0156566 | A1 * | 6/2010 | Abdolvand et al. | 333/195 |
| 2010/0176897 | A1 * | 7/2010 | Winkler et al. | 333/186 |

OTHER PUBLICATIONS

N. Kuo et al.; "Demonstration of Inverse Acoustic Band Gap Structures in AlN and Integration With Piezoelectric Contour Mode Transducers"; IEEE Transducers 2009, Denver, CO, USA, Jun. 21-25, 2009, pp. 2334-2337.*
S. Mohammadi et al.; "Acoustic Band Gap-Enabled High-Q Micro-Mechanical Resonators"; IEEE Transducers 2009, Denver, CO, USA, Jun. 21-25, 2009, pp. 2330-2333.*
Chinese language office action dated Jan. 5, 2012.

* cited by examiner

*Primary Examiner* — Barbara Summons
(74) *Attorney, Agent, or Firm* — McClure, Qualey & Rodack, LLP

(57) ABSTRACT

A resonator includes a resonating body and at least one periodic structure having one end connected to the resonating body. The periodic structure includes at least two basic structure units with duplicated configuration. The periodic structure blocks wave propagation caused by the vibration of the resonating body. The resonating body has a resonance frequency $f_0$. The periodic structure has a band gap characteristic or a deaf band characteristic within a particular frequency range, and the resonance frequency $f_0$ falls within the particular frequency range of the periodic structure.

35 Claims, 9 Drawing Sheets length : 200 μm , Thickness : 6+/-0.5 μm
h is held at 6 μm, band gap distribution is the function of a and r; and decide to adopt ABCD structures after calculating h+/-0.5 μm $$\overbrace{\text{A  B  C  D}}$$
sq15 sq18 hex sq8

Phononic crystal A TYPE
(Dead band : 140~180MHz)
(Dead band : 290~320MHz)
One broad dead band, but no band gap structure, is adopted to test the dead band

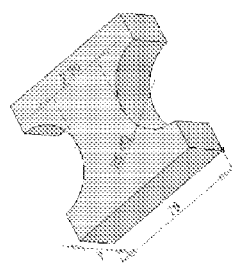

Phononic crystal B TYPE
(Band gap :180~200 MHz)
The highest process allowance band gap found using the square lattice by adjusting the parameters a, r and h

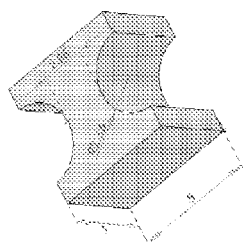

Phononic crystal C TYPE
(Band gap : 280~330MHz)
Currently found broadest band gap

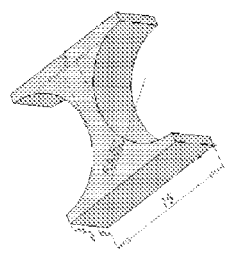

Phononic crystal D TYPE
(Band gap : 380~400MHz)
The highest band gap that can be found for the 6 μm thickness

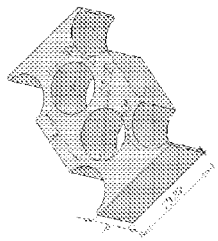

FIG. 12B

RESONATOR AND PERIODIC STRUCTURE

This application claims the benefit of Taiwan application Serial No. 98141263, filed Dec. 2, 2009, the subject matter of which is incorporated herein by reference.

BACKGROUND

1. Technical Field

The disclosure relates in general to a resonator, and more particularly to a resonator having a periodic structure.

2. Description of the Related Art

The micro electro mechanical system (MEMS) technology is to manufacture an electronic mechanical mechanism element on a silicon wafer substrate to implement the functions that cannot be conventionally obtained.

With the globalization of economic development and the requirements in the mobile and wireless multimedia communication, various wireless communication systems, such as Global System for Mobile Communications (GSM), Bluetooth, wireless local area network (WLAN), 3rd-generation (3G) of mobile communication technology, Worldwide Interoperability for Microwave Access (WiMAX), have been developed flourishingly in the past few years. At present, there are more than seven standards or bands applied to the wireless communication, wherein the standards respectively have their unique communication protocols, such as different bands, different channel bandwidths, and the like. In order to achieve the seamless communication connection, the future mobile phones adopt tunable high-frequency front-end modules to perform the settings according to different communication systems so that the reconfigurable system architecture can be implemented.

After the wireless communication system is developed toward the high frequency trend, the miniaturized, low-cost, modularized, monolithic high-frequency circuits manufactured on the silicon wafer substrate using the MEMS element manufacturing technology will play an important role in the future.

The loss of the conventional radio frequency element is increased with the increase of the frequency because the conductor and the medium are at the gigahertz (GHz) frequency. Thus, the film bulk acoustic-wave resonator (FBAR) working by way of mechanism resonance has gradually replaced the associated elements and thus become the main element of the filter for the mobile phone because it advantageously has the large size and the high quality factor (Q factor). However, the currently commercial film bulk acoustic-wave resonance filter has the quality factor Q ranging from about 800 to 1200 at 1 GHz and is only suitable for serving as a band selective filter. If a "channel selective filter" has to be developed to satisfy the next generation tunable channel selective high-frequency front-end module, the quality factor Q of the radio frequency MEMS resonator (RF MEMS resonator) has to be greater than or equal to 10,000 at 1 GHz. Thus, it is a major challenge to the international researchers and developers to design a resonator with the extremely high quality factor Q and thus to achieve the target of the channel selective filter.

Regarding to how to increase the product of frequency-quality factor (f-Q), the international research and development units presently aim at the target regarding how to lower the loss of the resonator within one resonance period. At present, the known loss mechanism of the resonating body may be obtained from the following equation:

$$\frac{1}{Q} \cong \frac{1}{Q_{air}} + \frac{1}{Q_{TED}} + \frac{1}{Q_{support}} + \frac{1}{Q_{surface}},$$

wherein:

$Q_{air}$ represents the air damping;
$Q_{TED}$ represents the thermoelastic damping (TED);
$Q_{support}$ represents the support loss; and
$Q_{surface}$ represents the surface loss.

In general, the loss item of air damping may be neglected in a system under vacuum (or low pressure) condition, and the surface loss in the mechanical structure resonator may also be neglected. So, the most important issue is to consider the two factors including the thermoelastic damping (TED) and the support loss. The main loss of the two factors in the high-frequency MEMS structure relates to the frequency. Some people have disclosed that the support loss will be the main reason of disabling the quality factor Q of the resonator Q from being increased at the high frequency (>100 MHz) in some references (theoretical and experimental references). Therefore, some academic institutions and MEMS manufacturers have devoted themselves to the analysis and computation of the support loss and disclosed various patented techniques to prevent the elastic waves from propagating to the substrate through the support beam and thus to increase the quality factor Q.

In a conventional resonator structure, the resonating body is mounted on the substrate using the support beam, and the resonating body, the support beam and the substrate are made of the same material, such as silicon, and thus have the same acoustic impedance (see Equation (1)). The vibration energy can be transferred on the same material more easily. Thus, after the elastic waves of the resonating body propagate to the support beam, the elastic waves are substantially completely (close to 100%) lost on the substrate without reflection.

$$Z = \rho * \sqrt{\frac{E}{\rho}} \qquad (1)$$

Two different patented techniques are disclosed in the following, and the technical contents thereof are to prevent the elastic waves from propagating to the substrate through the support beam so that the loss can be reduced and the quality factor Q can be increased.

U.S. Pat. No. 6,628,177 (hereinafter referred to as '177 patent) entitled "Micromechanical resonator device and micromechanical device utilizing same" discloses an MEMS resonating element, as shown in FIG. 1. Regarding the technical means of the '177 patent, a diamond film is grown into a body of a disk resonator, the acoustic wave impedances of diamond and silicon are different from each other and are respectively $6.18*10^7$ Kg/m$^2$/s and $1.85*10^7$ Kg/m$^2$/s. Thus, an elastic wave reflecting surface is formed to reflect the body waves back to the resonating body to form a high quality factor (High-Q) resonator. The resonator structure of FIG. 1 mainly includes a diamond disk resonating body (diamond disk) 101, a polysilicon stem 102 and a nodal ring 104. When the acoustic wave reaches an interface 105 between the diamond and the silicon, it is reflected back to the resonating body. Thus, the interface 105 also serves as the acoustic wave reflecting surface. The diamond is the surface reflecting material having the maximum acoustic wave impedance in the nature.

The experimental data of '177 patent is also disclosed in IEEE journal in 2004, as shown in the following Table 1. As shown in Table 1, it is obtained that the quality factor Q of the disk resonator with the diamond film may be significantly increased by more than six times (55300/8100≅6.83).

TABLE 1

| Module (Mode) | Stem material | Disk material | Stem Diam., μm | Disk Diam., μm | Res. Freq., MHz | Quality Factor Q |
|---|---|---|---|---|---|---|
| First Module | Silicon | Silicon | 1.6 | 22.0 | 245.1 | 8,100 |
| First module | Silicon | Diamond | 1.6 | 22.0 | 497.58 | 55,300 |

An elastic wave reflecting surface for reflecting energy may be generated using different materials, and the use of the diamond film can handle all the bandwidths.

Another U.S. Pat. No. 7,295,088 (hereinafter referred to as '088 patent) entitled "High-Q micromechanical resonator devices and filters utilizing same" discloses another MEMS resonating element, as shown in FIG. 2. The MEMS resonating element mainly includes an annular resonating body 201, a middle anchor 202 and a cruciform support beam 203. The annular resonating body 201 has a central cavity, and the middle anchor 202 is disposed at a central location of the central cavity of the annular resonating body 201. The cruciform support beam 203 outwardly and radially connected to an inner ring of the annular resonating body 201 from the middle anchor 202 to support the resonating body 201. The external side and the internal side of the annular resonating body 201 are respectively formed with a sense electrode 205 and a drive electrode 206, and the electrodes overlap with each other so that the overall support structure cannot be easily interfered and the high quality factor Q and the low impedance can be obtained.

Unlike the '177 patent, in which two different materials of the diamond and the silicon are adopted, the '088 patent discloses the following features. Under the same material parameter (i.e., the resonating body 201, the middle anchor 202 and the cruciform support beam 203 are made of the same material), the cruciform support beam 203 is connected to the substrate, and this may be regarded as the completely short-circuited (i.e., the impedances completely match). However, when the length of the cruciform support beam 203 is gradually increased to the quarter-wavelength, the impedances have the maximum mismatch because one end has the maximum deformation while the other end has the minimum deformation. So, the maximum energy may be reflected back to the resonating body 201. Thus, the main technological feature of the '088 patent is that: when the length of the cruciform support beam 203 is equal to the quarter-wavelength or (2n+1) times of the wavelength, the resonating element of FIG. 2 has the highest quality factor Q (Q is equal to about 14,643 at the frequency of 1.2 GHz).

SUMMARY

The disclosure is directed to a resonator and a periodic structure.

According to a first aspect of the present disclosure, a resonator is provided. The resonator includes a resonating body and at least one periodic structure having one end connected to the resonating body. The periodic structure includes two basic structure units with duplicate configuration. The periodic structure may be adopted to block the wave propagation caused by the vibration of the resonating body.

According to a second aspect of the present disclosure, a periodic structure manufactured using Micro-Electro-Mechanical-System (MEMS) manufacturing processes is provided. The structure includes a one-dimensional periodic structure body, which includes a basic structure unit. The basic structure unit is acquired from a plate-like structure having two-dimensional lattice periodic holes, and the basic structure unit is repeatedly arranged in a one-dimensional direction to constitute the one-dimensional periodic structure body. The basic structure unit is acquired from the area that four orthogonal geometric scribing lines enclose on the plate-like structure having the two-dimensional lattice periodic holes, and the geometric scribing lines pass through the contours the periodic holes.

The disclosure will become apparent from the following detailed description of the exemplary but non-limiting embodiments. The following description is made with reference to the accompanying drawings.

BRIEF DESCRIPTION OF THE DRAWINGS

FIG. 12A and FIG. 12B provide some associated implementing data for design reference in practice, such as the operating frequency and the selection of the phononic crystal pattern with respect to various dimensions.

DETAILED DESCRIPTION

The disclosure provides a resonator structure including a resonating body and a periodic structure, which has one end connected to the resonating body, and includes two basic structure units with duplicate configuration. According to the embodiments of the disclosure, when the resonating body vibrates, the periodic structure can reflect the elastic wave and block wave propagation such that lower the wave propagation energy loss and thus increase the quality factor Q of the resonator. Furthermore, the implementation of the disclosure may be compatible with the current MEMS manufacturing processes.

Some exemplary embodiments of the disclosure will be disclosed in the following description. However, the resonator structures disclosed in the embodiments are only for the illustrative but non-limitative purpose. Furthermore, the unessential elements are omitted from the drawings of the embodiments for the sake of clearly illustrating the technical features of the disclosure.

First embodiment

Figure 1:
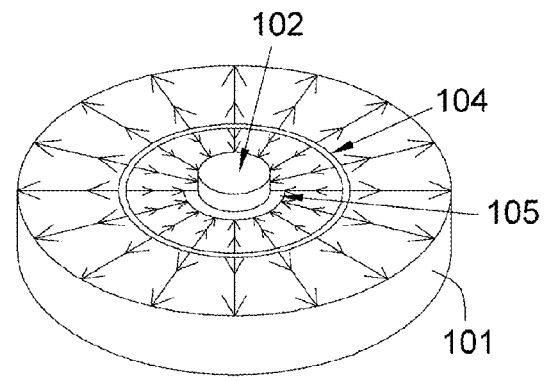
FIG. 1 (Prior Art) is a schematic illustration showing a conventional MEMS resonating element, wherein a diamond film is grown into a body of a disk resonator.
Figure 2:
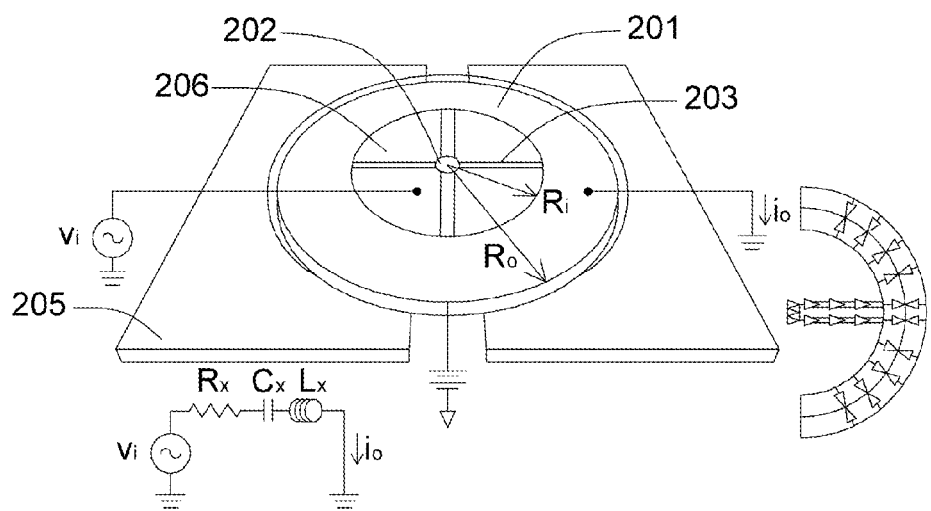
FIG. 2 (Prior Art) is a schematic illustration showing another conventional MEMS resonating element.
Figure 3:
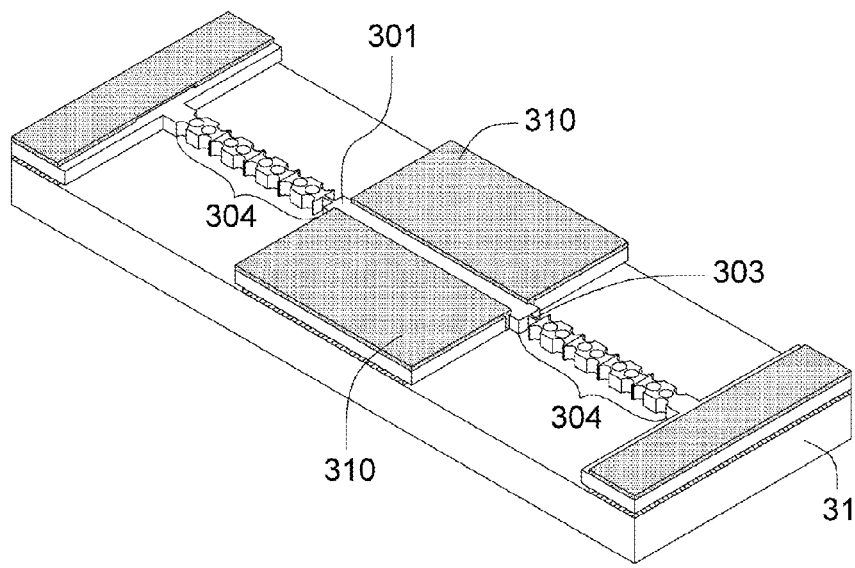
FIG. 3 is a schematic illustration showing a resonator according to a first embodiment of the disclosure.

FIG. 3 is a schematic illustration showing a resonator according to a first embodiment of the disclosure. Referring to FIG. 3, the resonator includes a resonating body 301 and a periodic structure 304. In the first embodiment, the resonator includes a support beam 303 connected to the resonating body 301 and the periodic structure 304, and each of two ends of the resonating body 301 has one set of the support beam 303 and the periodic structure 304, as shown in FIG. 3.

The shape of the resonating body 301 may be a square, rectangular, circular or annular block or block of any other shapes. In this embodiment, the resonating body 301 is a rectangular block body and is disposed between two driving electrodes 310 so that the demonstration of the resonator may be made. The wall surfaces of the driving electrode 310 and the resonating body 301 are separated from each other by a gap having, for example, several tens of nanometers (nm), and the resonating body 301 produces the resonance by way of the electrostatic force. The resonating body 301 has a resonance frequency $f_0$ in a workable mode, while the periodic structure 304 has a band gap characteristic or a deaf band characteristic within a particular frequency range. The resonance frequency $f_0$ of the resonating body 301 falls within the particular frequency range of the designed periodic structure 304. The periodic structure 304 is also referred to as the phononic crystal in the professional field of elastic wave propagation, and the phononic crystal can block elastic wave/mechanical wave propagating from the resonating body 301.

Figure 4A:
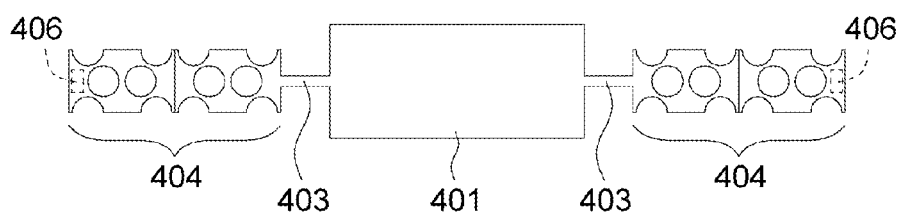
FIG. 4A is a top view showing another resonator according to the first embodiment of the disclosure.
Figure 4B:
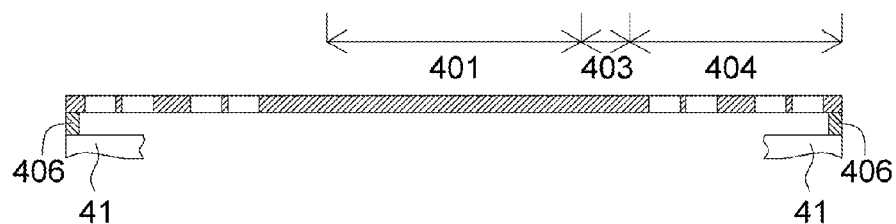
FIG. 4B is a side view of FIG. 4A.

Please refer to FIG. 4A and FIG. 4B simultaneously. FIG. 4A is a top view showing another resonator according to the first embodiment of the disclosure. FIG. 4B is a side view of FIG. 4A. In this resonator, one side of a resonating body 401 is connected to one end of a periodic structure 404 through a support beam 403, and an anchor 406 is disposed under the other end of the periodic structure and on a substrate 41 such that a distance is formed between the substrate 41 and each of the resonating body 401, the support beam 403 and the periodic structure 404. Similarly, one set of support beam 403 and periodic structure 404 is disposed at each of two ends of the resonating body 401, as shown in FIG. 4A and FIG. 4B, and the structures thereof are typically (without limitation to) in the symmetrical forms.

When the MEMS resonator operates at the high frequency, its quality factor is determined by the loss caused when the energy is transferred from the anchor 406 to the substrate 41. In an embodiment of the disclosure, the periodic structure 404 is disposed between the resonating body 401 and the substrate 41, and the phononic crystal, which has the suitable dimension and can cause the band gap, is designed. According to the physical property that the phononic crystal can reflect the elastic wave, the energy cannot be transferred to the anchor 406 so that the loss caused when the energy is transferred to the substrate 41 can be lowered, and the high quality factor (High-Q) can be achieved. Thus, the structures shown in FIG. 3, FIG. 4A and FIG. 4B correspond to a high-Q resonator having the periodic structure serving as a reflecting boundary. After the high-Q resonator is integrated, it can be adopted in the application of some important components, such as a filter, in the wireless communication system.

When the resonator structure according to this embodiment of the disclosure is being manufactured, it is unnecessary to use different materials, such as including the diamond film and the silicon disclosed in the '177 patent. Instead, the same material (e.g., silicon) is adopted to manufacture the resonator structure so that the manufacturing processes of this embodiment are compatible with the MEMS manufacturing processes, such as the CMOS manufacturing processes. So, the manufacturing cost may not be increased, and the embodiment is suitable for many applications in the commercial market. Furthermore, the resonator structure according to the embodiment of the disclosure may be formed by selecting any one of the suitable manufacturing processes of the MEMS manufacturing processes according to various conditions, wherein the resonating body and the periodic structure (and the support beam, if any) may be integrated into a single support beam with the structure defect, as shown in FIG. 9B and FIG. 9C. In this embodiment, the resonating body and the periodic structure may be made of the same material.

In addition, the periodic structure according to this embodiment of the disclosure includes two or more than two (e.g., 3, 4, . . . and p, wherein p is a positive integer greater than or equal to 2) basic structure units with the duplicate configuration. Each basic structure unit may be, for example, a one-dimensional periodic architecture, a rectangular lattice architecture, a hexagonal lattice architecture or any other structure. The disclosure is not particularly restricted as long as the basic structure unit has the band gap characteristic or the deaf band, and the band gap/deaf band covers the resonance frequency $f_0$ of the working mode of the resonator so that the elastic wave cannot propagate on the periodic structure.

The periodic structures according to the basic structure units having the hexagonal lattice architecture and the rectangular lattice architecture respectively are illustrated below.

Figure 5A:
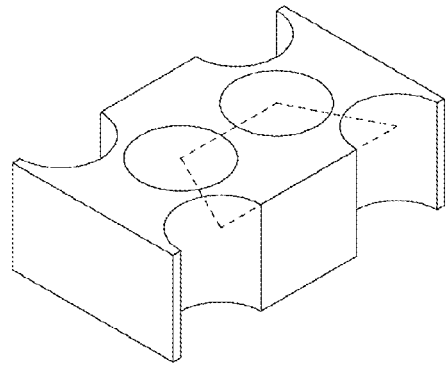
FIG. 5A is a schematic illustration showing a basic structure unit having a hexagonal crystal defect in the periodic structure according to the first embodiment of the disclosure.
Figure 5B:
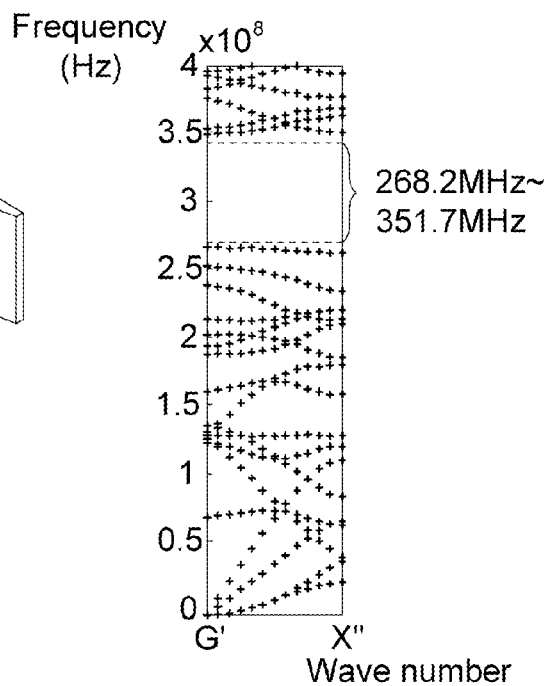
FIG. 5B is a schematic illustration showing the hexagonal crystal defect of FIG. 5A and the dispersion curve of the one-dimensional periodic structure under a specific dimension.

Please refer to FIG. 5A and FIG. 5B. FIG. 5A is a schematic illustration showing a basic structure unit having a hexagonal crystal defect architecture in the periodic structure according to the first embodiment of the disclosure. FIG. 5B shows the hexagonal crystal defect of FIG. 5A and the dispersion curve of the one-dimensional periodic structure under a specific dimension.

In FIG. 5A, one basic structure unit of the periodic structure has the hexagonal lattice architecture. That is, the centers of holes on the basic structure unit are arranged in a hexagonal lattice structure.

In a design example, if the resonating body is a rectangular resonance block body, its geometric dimensions include the height of 6 μm, the width of 14 μm and the length of 150 μm, the rectangular resonance block body has a resonance mode (adopting the SiBAR structure published by Geogia Tech), in which a longitudinal center axis serves as a node, then the resonance frequency $f_0$ is 301.2 MHz. The geometric dimensions of the support beam structure include the height of 6 μm, the length of 7 μm and the width of 2 μm, and the support beam structure is a rectangular block. In order to increase the value of Q, one end of the support beam is connected to the position of the node of the resonance mode of the resonating body. A structure body having periodicity may be designed, and the band gap phenomenon or the deaf band existing in the structure is utilized to reflect the elastic wave with the frequency of 301.2 MHz.

Figure 11:
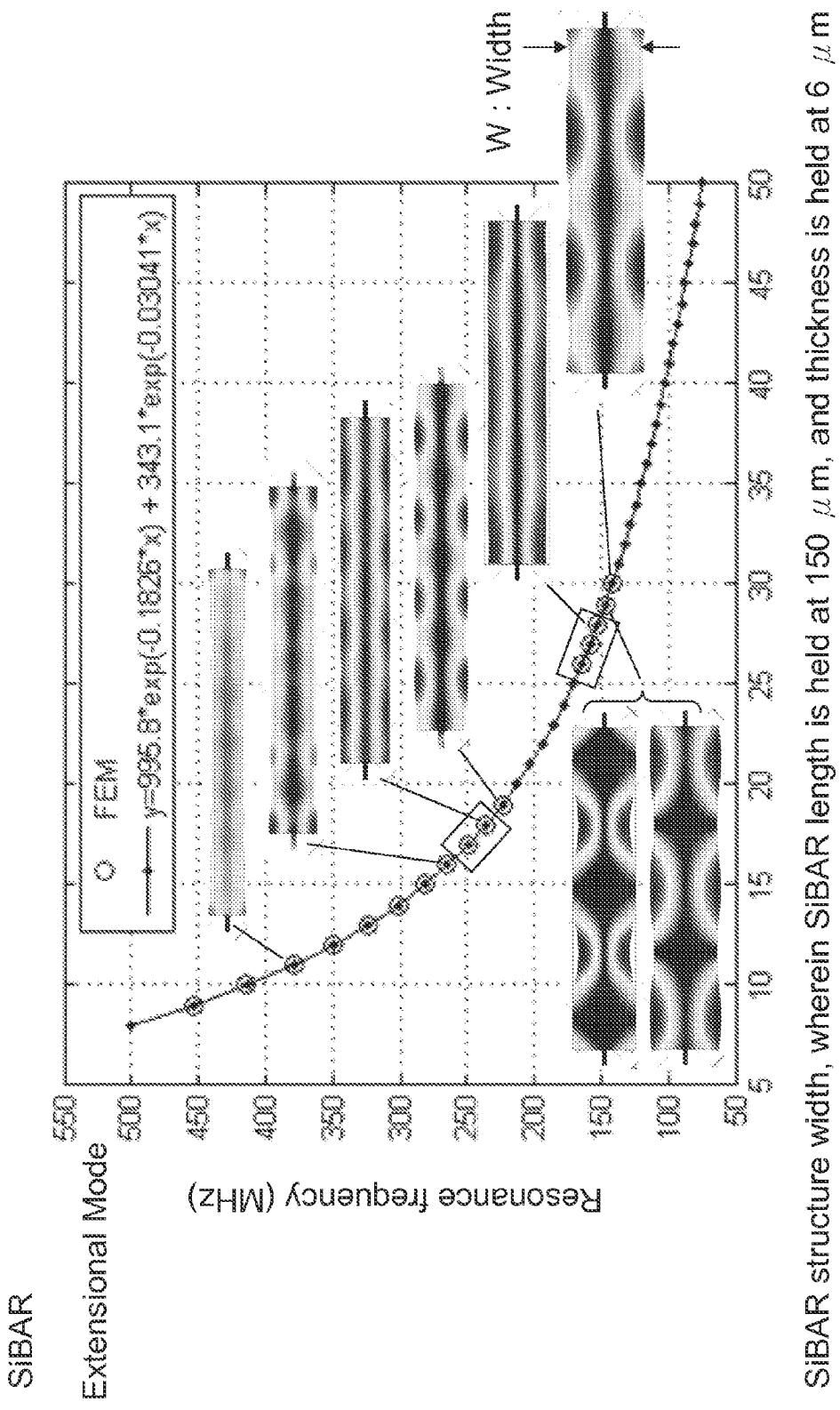
FIG. 11 discloses the relationship curve of the resonance frequency V.S. the width of SiBAR structure, wherein the SiBAR length is held at 150 μm, and the SiBAR thickness is held at 6 μm.

In addition, FIG. 11 also discloses the relationship curve of the resonance frequency V.S. the width of the SiBAR structure, wherein the SiBAR length is held at 150 μm, and the SiBAR thickness is held at 6 μm. When matching the rectangular resonance block body with the phononic crystal under the constant length and thickness, the desired operation frequency may be obtained by designing the width of the rectangular block.

If a hexagonal lattice periodic structure shown in FIG. 5A is to be designed, a periodic single crystal cell structure having the characteristic geometric lengths including a height of 6 μm, a hole radius of 2.6 μm and a hole center (hexagonal lattice arranged) gap of 6 μm may be obtained through the single crystal cell structure in conjunction with the simulation of the Bragg periodic boundary. FIG. 5B shows the dispersion curve obtained according to the dimensions of the hexagonal lattice periodic structure specified above. As shown in FIG. 5B, it is obtained that the hexagonal lattice periodic structure has a band gap characteristic ranging from 268.2 MHz to 351.7 MHz. When the resonance block body vibrates at the resonance frequency $f_0$ equal to 301.2 MHz, its resonance frequency $f_0$ falls within the band gap, and the periodic structure is in the non-propagating mode and thus can reflect the elastic wave transferred from the support beam. Thus, it is possible to prevent the energy from being transferred to the substrate through the anchor under the periodic structure.

Figure 6A:
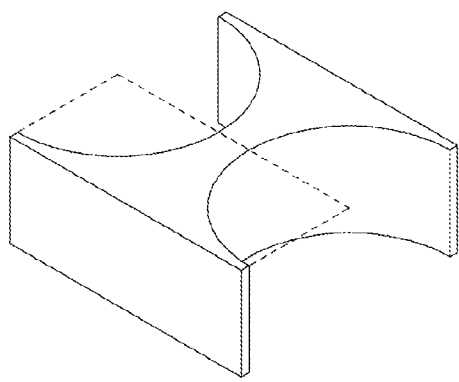
FIG. 6A is a schematic illustration showing a basic structure unit having a rectangular crystal defect architecture in the periodic structure according to the first embodiment of the disclosure.
Figure 6B:
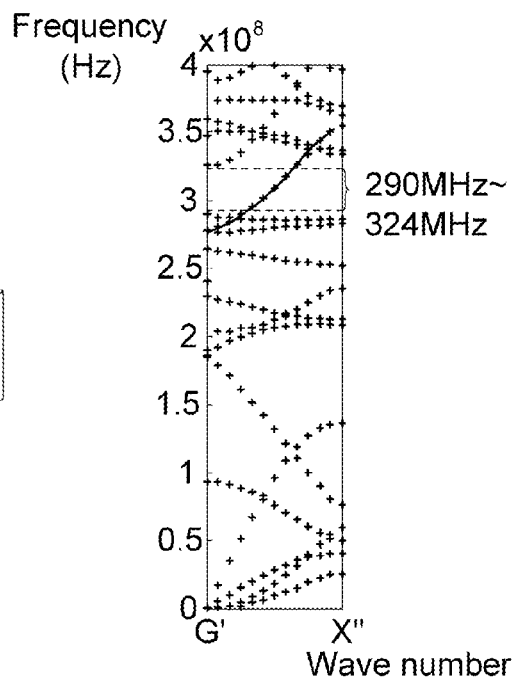
FIG. 6B is a schematic illustration showing the rectangular crystal defect of FIG. 6A and the dispersion curve of the one-dimensional periodic structure under a specific dimension.

FIG. 6A is a schematic illustration showing a basic structure unit having a rectangular crystal defect architecture in the periodic structure according to the first embodiment of the disclosure. FIG. 6B shows the rectangular crystal defect of FIG. 6A and the dispersion curve of the one-dimensional periodic structure under a specific dimension.

According to the dimensions of the resonating body and the support beam of the above-mentioned design example, it is also possible to obtain a single crystal cell structure shown in FIG. 6A through the simulation of the single crystal cell structure in conjunction with the Bragg periodic boundary, wherein the single crystal cell structure has the characteristic geometric lengths including the height of 6 μm, the hole radius of 6.5 μm, and the hole center gap of 15 μm, wherein the centers of the holes are arranged in a square lattice structure. FIG. 6B shows a dispersion curve obtained according to the dimensions of the rectangular lattice periodic structure specified above. As shown in FIG. 6B, it is obtained that the rectangular lattice periodic structure has an deaf band ranging from 290 MHz to 324 MHz with respect to the dimensions of the resonating body disclosed in the design example. When the resonance block body vibrates at the resonance frequency $f_0$ equal to 301.2 MHz, its resonance frequency $f_0$ falls within the deaf band, the wave propagation of the periodic structure is orthogonal to the oscillation of the bridging beam, and periodic structure is thus capable of reflecting the elastic wave transferred from the support beam. Thus, it is possible to prevent the energy from being transferred to the substrate through the anchor under the periodic structure.

Figure 12A:
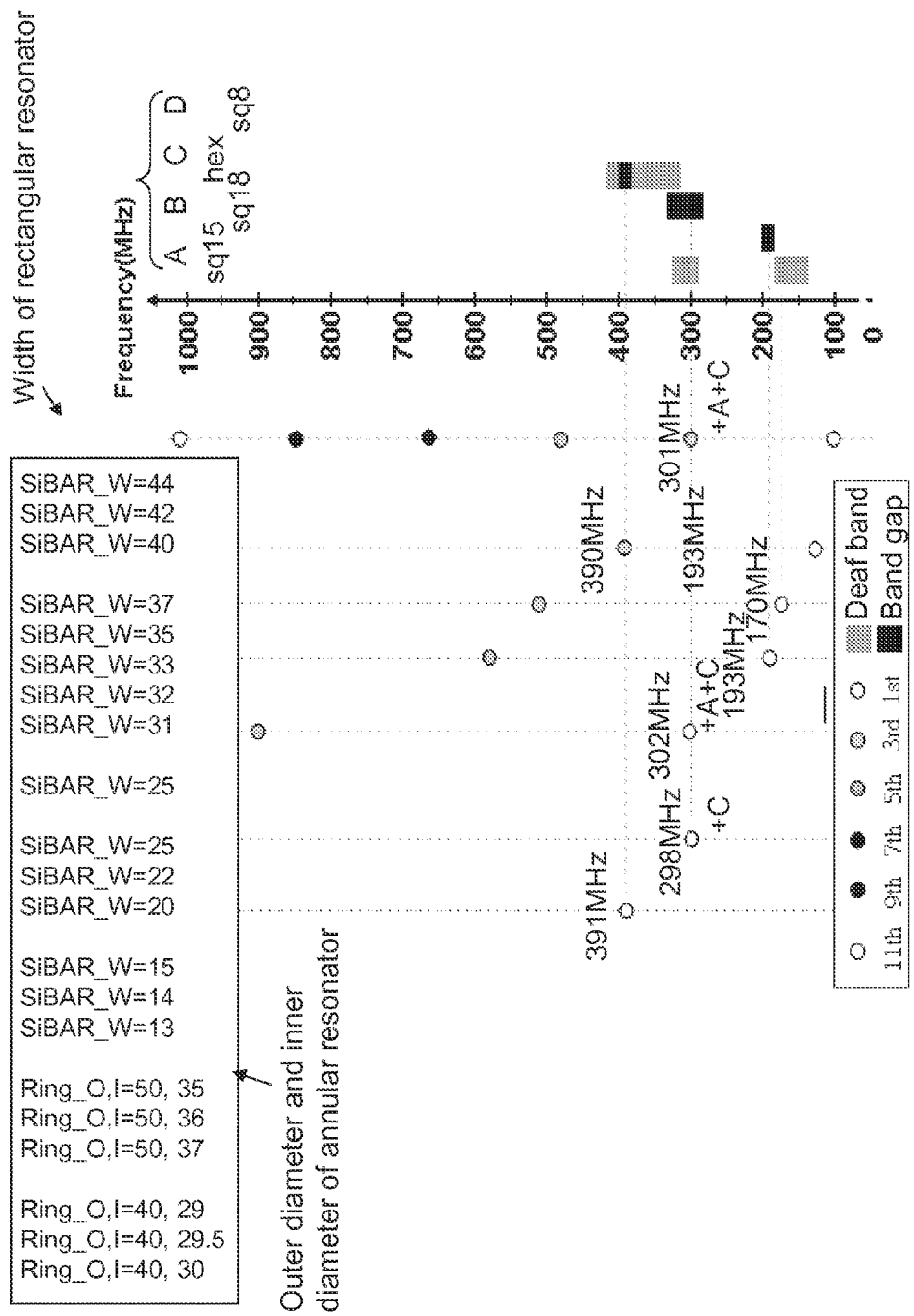

Furthermore, in a periodic structure, the structure dimension is proportional to the operating frequency. For example, if the design of the high quality factor resonator of one embodiment is finished with the operating frequency $f_0$ and the structure dimension is A×B×C, when the overall structure dimension is reduced to 0.5A×0.5B×0.5C, then the operating frequency becomes $2f_0$. On the contrary, if the overall structure dimension is enlarged into 2A×2B×2C, then the operating frequency is reduced to $(½)f_0$. FIG. 12A and FIG. 12B provide some associated implementing data for design reference in practice, such as the operating frequency and the selection of the phononic crystal pattern with respect to various dimensions. For example, when the resonating body dimension is 32 μm (width)×200 μm (length)×6 μm (thickness) and the operating frequency is at 390 MHz, a D-type phononic crystal (band gap: 380 to 400 MHz) may be correspondingly used.

In the resonator illustrated in FIG. 3, the periodic structure connected to one end of the resonating body includes four hexagonal lattice basic structure units shown in FIG. 5A (or four rectangular lattice periodic structures shown in FIG. 6A). In the resonator illustrated in FIG. 4A, the periodic structure connected to one end of the resonating body includes two basic structure units having the hexagonal lattice architectures (or the rectangular lattice periodic structure shown in FIG. 6A). The basic structure units of FIG. 3 and FIG. 4A are arranged in the one-dimensional direction and arranged in [1×4] and [1×2] matrix patterns, respectively. The number of the basic structure units contained in the periodic structure is preferably equal to two or greater than two; however, this number is not particularly restricted and can be properly selected according to the requirement of the application.

Although the support beam connects the resonating body to the periodic structure in the above-mentioned implementation, it is to be noted that the disclosure is not limited thereto. Also, the support beam may also be omitted and the periodic structure is directly connected to the one end of the resonating body.

Figure 7:
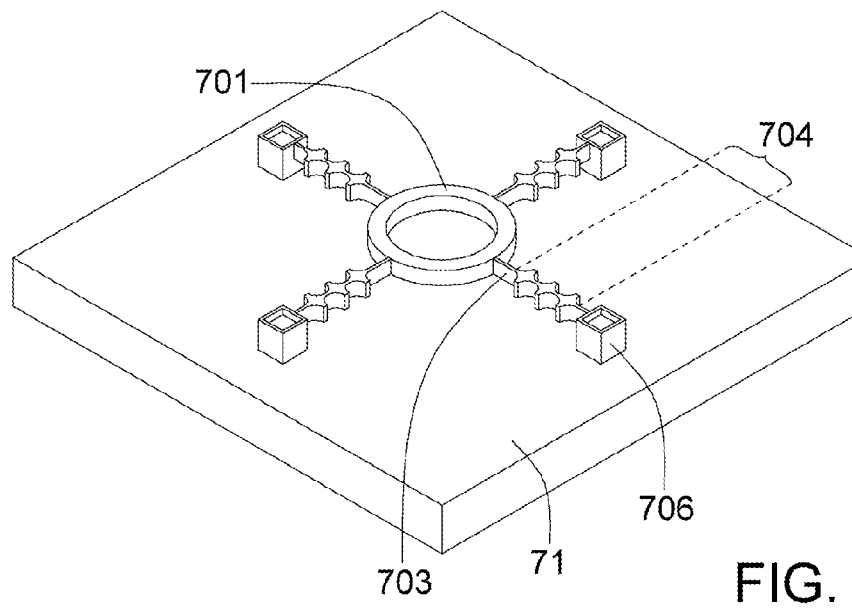
FIG. 7 is a schematic illustration showing still another resonator according to the first embodiment of the disclosure.

In addition, the number of periodic structures connected to a resonating body is not particularly restricted. In the resonator structure illustrated in FIG. 3 and FIG. 4A, each of the two ends of the resonating body is connected to one set of periodic structures through the support beam, and may also be connected to 3, 4, . . . , and r sets of periodic structures (r is a positive integer) according to the application and requirement of the resonator. The disclosure does not intend to make any restriction. FIG. 7 is a schematic illustration showing still another resonator with the high quality factor according to the first embodiment of the disclosure. As shown in FIG. 7, the resonator has an annular resonating body 701 and four periodic structures 704 respectively connected to nodes of the annular resonating body 701 through support beams 703. The other ends of each of periodic structures 704 are disposed on a substrate 71 using anchors 706. There is space between the substrate 71 and each of the annular resonating body 701, the support beams 703 and the periodic structures 704. Furthermore, in the resonator illustrated in FIG. 7, each of periodic structures 704 include three basic structure units arranged in a [1×3] matrix pattern, and each basic structure unit has a rectangular lattice structure shown in FIG. 6A.

In addition, the periodic structures connected to the resonating body of the resonator (through the support beams or not) in practice may contain the basic structure units, which have different patterns or numbers or have the same pattern or number. For example, each basic structure unit may include a lattice structure, various lattice architectures which are different from one another, or various lattice architectures which are the same. The periodic structures may also be symmetrical or non-symmetrical, and the disclosure does not intend to make any limitation thereto.

In addition, the periodic structure is depicted to have circular holes in the drawings of the embodiment. However, the disclosure is not limited thereto. The hole may also have other shapes, such as the rectangular shape, the triangular shape, the elliptic shape and the like. Furthermore, the hole may be filled with air and may also be filled with the substance different from the material of the basic structure unit. For example, if the material of the basic structure unit is silicon, then the hole may be filled with tungsten or the material other than silicon. More specifically, the disclosure covers all the implementation of periodic structure which has the band gap characteristic or the deaf band that can reflect the elastic wave transferred from the resonating body.

Second Embodiment

In the illustrated first embodiment, at least two basic structure units of each of periodic structure are arranged in a one-dimensional direction, that is, arranged in a [1×p] matrix pattern, wherein p is a positive integer greater than or equal to 2. However, the disclosure is not limited thereto. The basic structure units of the periodic structure may also be arranged in a two-dimensional direction, that is, arranged in a [m×n] matrix pattern, wherein m and n are respectively positive integers greater than or equal to 2.

Figure 8A:
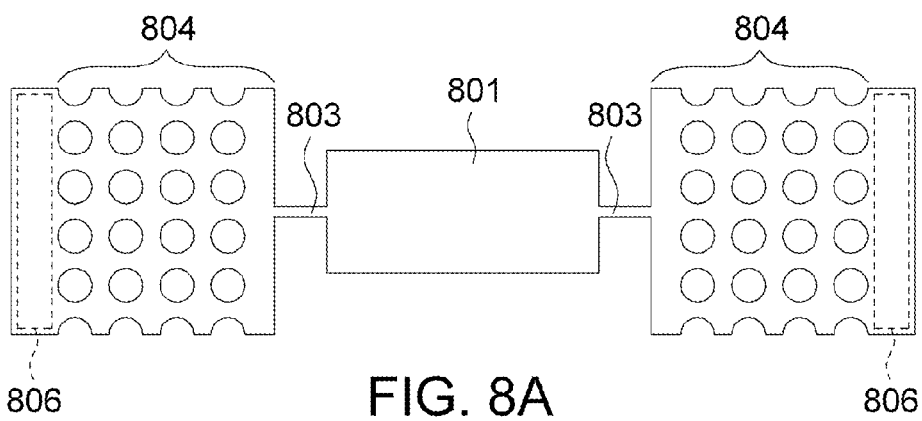
FIG. 8A is a top view showing a resonator according to a second embodiment of the disclosure.

FIG. 8A is a top view showing a resonator according to a second embodiment of the disclosure. As shown in FIG. 8A, one support beam 803 and one periodic structure 804 are disposed on each of two sides of a resonating body 801, and the structure thereof is in a symmetrical manner but is not limited thereto. When viewed from one side of the resonating body 801, one end of the periodic structure 804 is connected to the resonating body 801 through one support beam 803, and the other end of the periodic structure is disposed on a substrate (not shown in FIG. 8A) through an anchor 806 so that a space is formed between the substrate and each of the resonating body 801, the support beam 803 and the periodic structure 804. Furthermore, the basic structure units of each of periodic structure 804 are arranged in two-dimensional directions, that is, arranged in a [5×4] matrix pattern. In addition, each basic structure unit has the rectangular lattice structure. That is, the centers of the holes are arranged in a square lattice structure.

Figure 8B:
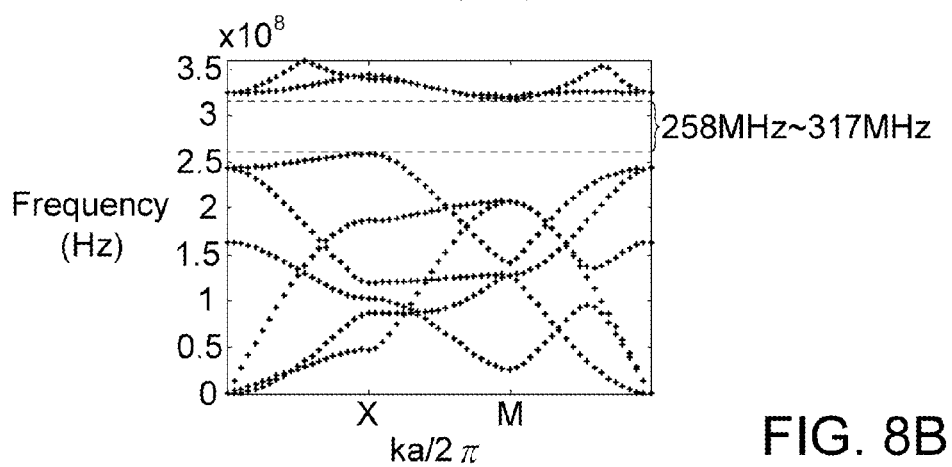
FIG. 8B is a schematic illustration showing the dispersion curve of the periodic structure of the resonator of FIG. 8A under a specific dimension.

FIG. 8B shows the dispersion curve of the periodic structure of the resonator illustrated in FIG. 8A under a specific dimension. As shown in FIG. 8B, the periodic structure has a band gap characteristic within the band ranging from 258 MHz to 317 MHz. When the resonance block body of the design example is applied to vibration at the resonance frequency $f_0$ of 301.2 MHz (see the descriptions associated with the first embodiment), its resonance frequency $f_0$ falls within the band gap, and the periodic structure 804 is in a non-propagation mode and thus can reflect the elastic wave transferred from the support beam 803. Thus, it is possible to prevent the energy from being transferred to the substrate through the anchor 806 under the periodic structure 804. When the resonator is operating at the high frequency, the high quality factor is determined by the loss in the case when the energy is transferred from the anchor 806 to the substrate. The periodic structure 804 of FIG. 8A arranged in the two-dimensional direction is a phononic crystal having the band gap characteristic so that the perfect reflecting boundary condition is almost achieved and the very high quality factor (High-Q) can be obtained. When an operating frequency of the resonator is higher than 100 MHz, its quality factor may be greater than 10000.

In practice, the resonator structure of the second embodiment may be manufactured at a time in a certain MEMS process so that the cost can be reduced. Furthermore, the resonator structure may be made of other materials which may be adopted in the silicon manufacturing processes or the MEMS manufacturing processes.

In summary, the periodic structure, in other words, includes a one-dimensional periodic structure body constituted by at least one basic structure unit, which is acquired from a plate-like structure having two-dimensional lattice periodic holes and the basic structure unit is repeatedly arranged in a one-dimensional direction to constitute a one-dimensional periodic structure body. The basic structure unit is acquired from the area that four orthogonal geometric scribing lines enclose on the plate-like structure having the two-dimensional lattice periodic holes, and the geometric scribing lines pass through the contours of the periodic holes. Furthermore, the basic structure unit acquired from the plate-like structure having two-dimensional lattice periodic holes has a band gap or a deaf band characteristic when being periodically infinitely arranged in the one dimension so that the elastic wave entering the one end of the one-dimensional periodic structure cannot propagate to the other end. In addition, the basic structure unit may be acquired from the plate-like structure (see FIG. 6A) having two-dimensional square lattice holes, the plate-like structure having two-dimensional triangular lattice holes, the plate-like structure (see FIG. 5A) having two-dimensional hexagonal lattice holes or any other plate-like structure having lattice holes arranged in any other shape. The hole on the plate-like structure may have a circular cross section, an elliptic shape cross section, a polygonal cross section or any other shape of cross section.

Various modifications may be properly made according to the technological concept of the disclosure (see the contents of the first embodiment), so detailed descriptions thereof will be omitted.

Simulation Results

In the simulation, the resonator having the periodic structure serving as the reflecting boundary is composed of a resonance block, at least one support beam and at least one periodic structure. The simulation verifies the propagation behavior of the elastic waves in the region located from the support beam to the substrate in a numerical manner. Because it is impossible to create an infinitely large substrate in the simulation, an absorption material is connected to a right end of the substrate to simulate the condition that the waves propagate to the infinitely far location of the substrate. When the resonance block body is vibrating, it pushes the support beam. Thus, a wave source is given on the support beam to simulate the condition that the portion (support beam) is connected to a resonance block body.

Figure 9A:
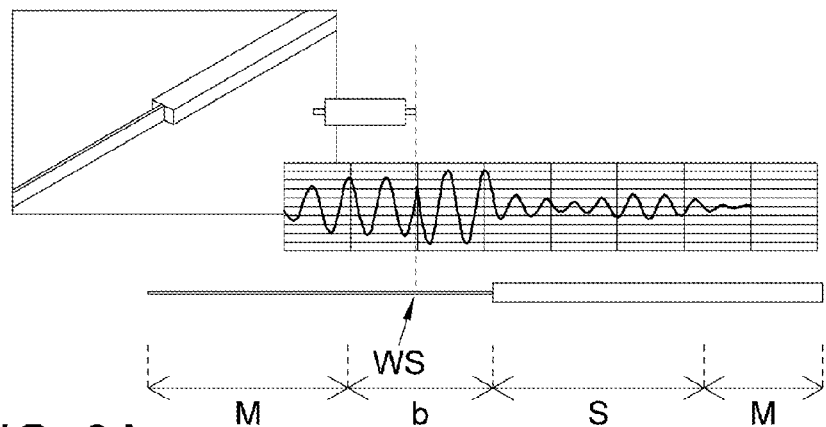
FIG. 9A is a schematic illustration showing the simulated energy transmission analysis wave propagation result of a resonator without a periodic structure.
Figure 9B:
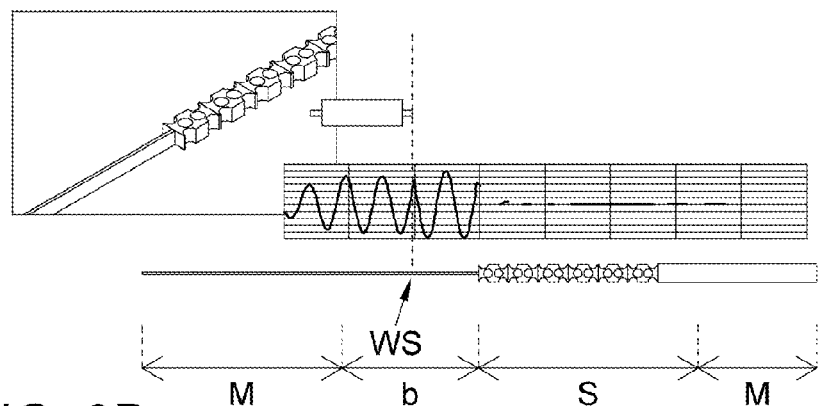
FIG. 9B is a schematic illustration showing the simulated vibration test wave propagation result of a resonator having a hexagonal crystal defect and a one-dimensional periodic structure.
Figure 9C:
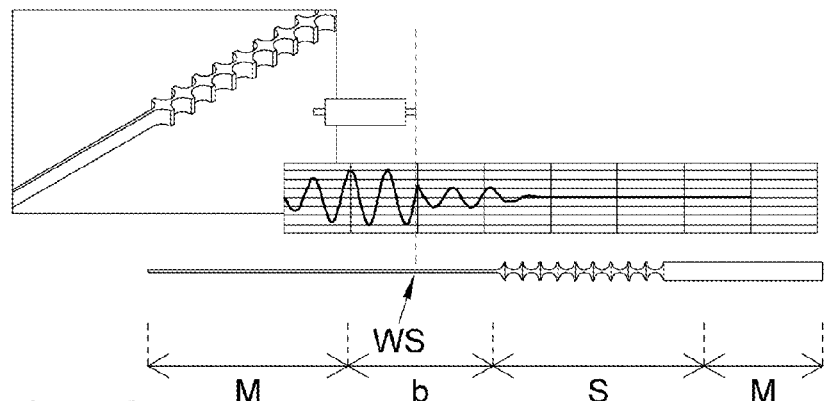
FIG. 9C is a schematic illustration showing the simulated vibration test wave propagation result of a resonator having a square crystal defect and a one-dimensional periodic structure.

FIG. 9A is a schematic illustration shows the simulated energy transmission analysis of wave propagation result of a resonator without a periodic structure. FIG. 9B shows the simulated wave propagation result of a resonator having a hexagonal crystal defect and a one-dimensional periodic structure in vibration test. FIG. 9C shows the simulated wave propagation result of a resonator having a square crystal defect and a one-dimensional periodic structure in vibration test. As shown in FIG. 9A to FIG. 9C, M represents the absorption material, b represents the support beam, S represents the substrate region and WS represents the wave source. FIG. 9A is an illustration of a control group experiment, while FIG. 9B and FIG. 9C are to simulate the energy transmission analysis of the periodic structures arranged in the one-dimensional direction according to the first embodiment of the disclosure. Thus, it is possible to compare the elastic wave propagation behaviors of the resonators with or without the periodic structures, wherein the elastic waves entering the substrate region is regarded as the energy loss of the wave propagation.

Observing the simulation results, it is found that the elastic wave of the resonator without the periodic structure can continuously propagate to and enter the substrate region, as shown in FIG. 9A. In the resonator with the periodic structure and using the hexagonal lattice periodic structure having a band gap characteristic according to the embodiment of the disclosure, the elastic wave thereof cannot continuously propagate, as shown in FIG. 9B. If the square lattice periodic structure having a deaf band is used, the elastic wave thereof disappears after entering the substrate region by a small distance, and thus cannot continuously propagate in the substrate region, as shown in FIG. 9C.

Figure 10:
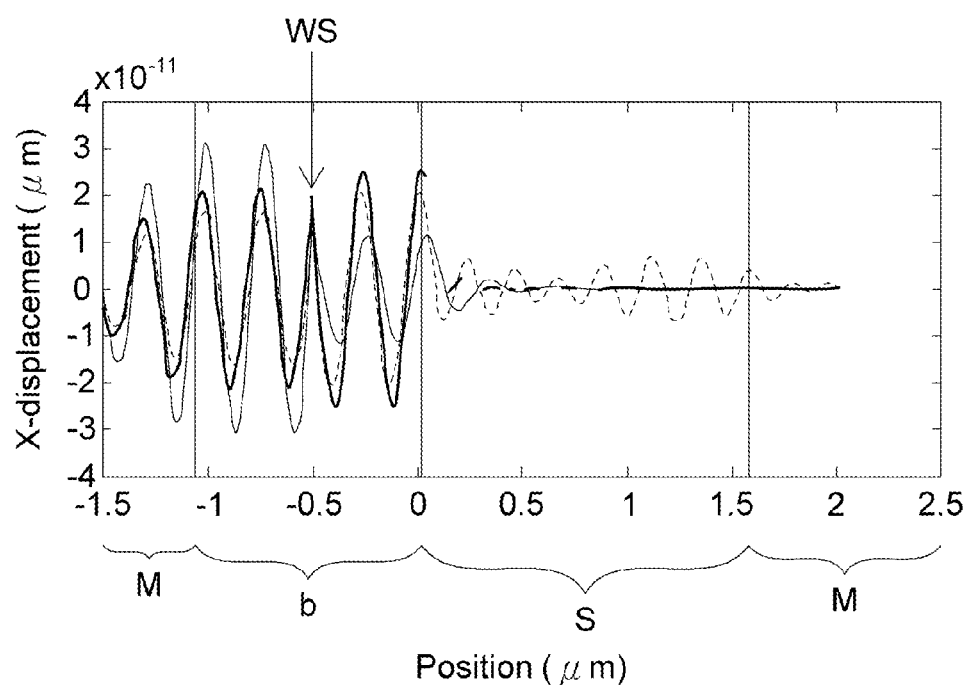
FIG. 10 is a schematic illustration showing the comparisons between the elastic wave propagation behaviors of the examples with or without the periodic structure.

FIG. 10 is an illustration shows the comparisons between the elastic wave propagation behaviors of the examples with or without the periodic structure. The elastic wave entering the substrate region is regarded as the energy loss of wave propagation. Similarly, in FIG. 10, M represents the absorption material, b represents the support beam, S represents the substrate region and WS represents the given position of the wave source.

According to the simulation result shown in FIG. 10, it is obtained that the estimated energy difference between two implementations in the substrate region reaches two orders of magnitude. From the point of view of energy loss of wave propagation, it is concluded that the quality factor Q of the resonator with the periodic structure is higher than that of the resonator without the periodic structure by more than 100 times. As to the existing art, an improvement for suppressing the wave propagation loss is done through the diamond resonance block body in conjunction with the silicon-bridging beam ('177 patent). Using the mismatch of the acoustic impedances of two kinds of materials to suppress the energy loss of wave propagation, which only suppresses ¼ times of the energy loss of wave propagation. The acoustic impedance of the periodic structure with the band gap according to the disclosure may be regarded as infinitely large. That is, almost all the energy loss of the wave propagation may be suppressed.

Of course, those skilled in the art may predict that the practical resonator element may have other types of energy losses (e.g., the loss of the material itself). Thus, the resonator having the periodic structure according to the embodiment of the disclosure may be regarded as reducing the energy loss of wave propagation to the minimum. So, the quality factor Q may be very high, and the final experimental Q is only restricted to the thermoelastic damping (TED) of the material itself.

In summary, the resonator of the embodiment of the disclosure adopts the periodic structure interposed between the resonating body and the substrate, and the periodic structure has the adequate dimensions to form a phononic crystal with the band gap characteristic. The phononic crystal can reflect the elastic wave to block the wave propagation caused when the resonating body vibrates and the loss caused when the energy is transferred to the substrate can be lowered, the perfect reflecting boundary condition can be almost reached and the high quality factor can be obtained. Furthermore, the resonator according to the embodiment of the disclosure may be made of the same material (e.g., silicon), and is thus compatible with the current MEMS manufacturing processes. So, it is unnecessary to adopt different materials including diamond and silicon, as being adopted in the prior art, and the manufacturing cost cannot be increased. The property of the periodic structure may be regarded as an artificial perfect material (prefect boundary condition) having the acoustic impedance, which may be regarded as infinitely large, according to the phenomenon that the elastic wave cannot propagate when the periodic structure (phononic crystal) produces the band gap.

According to the associated simulation result, it is proved that the quality factor Q of the resonator having the periodic structure can be greatly improved so that the f-Q product is extremely high. This MEMS resonator with the ultra-high quality factor may be applied to replace the conventional frequency selective filter, such as the film bulk acoustic-wave resonator (FBAR), SAW, and the like, used in the existing mobile phone. This is because its performance (Q) is higher than that of the conventional filter, and it is unnecessary to consider the uniformity of thickness as compared with the FBAR. Furthermore, the resonator has the ultra-high quality factor Q, and thus can implement one of the future mobile communication solutions already being proposed. That is, a channel selective filter serves as the RF front end device, and the software defined radio (SDR) is also adopted to implement the seamless communication system.

Table 2 simply lists the differences and various characteristic comparisons between the disclosure and the two prior arts.

TABLE 2

| | The disclosure | Prior art 1 | Prior art 2 |
|---|---|---|---|
| Means | The phononic crystal is composed of periodic structures, generates a band gap within a particular frequency range, and may be regarded as an artificial perfect | The diamond film with the maximum acoustic wave impedance in the nature serves as the surface reflecting material. | The anchor is caused to have the minimum displacement according to the quarter-wavelength conversion. |

TABLE 2-continued

| | | The disclosure | Prior art 1 | Prior art 2 |
|---|---|---|---|---|
| Characteristics | | surface reflecting material (under the finite bandwidth). | | |
| | Energy transmittance | Lowest (calculate the transmittance <2% by FEM) | Medium (calculate the transmittance of about 75% by acoustic impedance) | Medium (from experimental data: correspond to prior art 1) |
| | Q | Highest (Q will be greatly improved to be controlled by the material) | Medium (f-Q product is about $10^{13}$) | Medium (f-Q product is about $10^{13}$ according to the experimental data) |
| | Process yield | Good (bandwidth (ex: 30%) is sufficient to overcome the process variation) | Good (bandwidth (ex: 100%) is sufficient to overcome the process variation) | Poor (single frequency is insufficient to overcome the process variation) |
| | Cost | Low | High (diamond film processes are required) | Low |
| | Suitable oscillator mode | All (can block all polarized waves) | All (can block all polarized waves) | Partial (can block particular polarized waves) |
| | CMOS Integration | Compatible | Incompatible (diamond film growing temperature 8000° C.) | Compatible |

While the disclosure has been described by way of examples and in terms of preferred embodiments, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A resonator, comprising:
    a resonating body;
    at least one periodic structure having one end connected to the resonating body and comprising two basic structure units with duplicate configuration; and
    at least one support beam having one end connected to the resonating body and the other end connected to the periodic structure;
    wherein the resonating body, the support beam and the periodic structure are integrated into a single structure of the support beam with a structure defect, and the periodic structure blocks wave propagation caused by vibrating of the resonating body.

2. The resonator according to claim 1, wherein the resonating body has a resonance frequency f0, the periodic structure has a band gap characteristic or a deaf band characteristic within a first frequency range, and the resonance frequency f0 falls within the first frequency range of the periodic structure.

3. The resonator according to claim 1, wherein the basic structure unit of the periodic structure is a one-dimensional periodic structure.

4. The resonator according to claim 1, wherein the basic structure unit of the periodic structure is a rectangular lattice structure.

5. The resonator according to claim 4, wherein the rectangular lattice structure has a plurality of holes having centers arranged in a square lattice structure.

6. The resonator according to claim 1, wherein the basic structure unit of the periodic structure is a hexagonal lattice structure.

7. The resonator according to claim 6, wherein the hexagonal lattice structure has a plurality of holes having centers arranged in a hexagonal lattice structure.

8. The resonator according to claim 1, wherein each of the basic structure units of the periodic structure comprises a lattice structure.

9. The resonator according to claim 1, wherein each of the basic structure units of the periodic structure comprises two lattice structures.

10. The resonator according to claim 9, wherein the two lattice structures are the same.

11. The resonator according to claim 9, wherein the two lattice structures are different from each other.

12. The resonator according to claim 1, wherein the basic structure units of the periodic structure are arranged in one-dimensional direction.

13. The resonator according to claim 12, wherein the basic structure units arranged in a m×n matrix, wherein m is equal to 1, and n is a positive integer greater than or equal to 2.

14. The resonator according to claim 1, wherein the basic structure units of the periodic structure are arranged in two-dimensional directions.

15. The resonator according to claim 14, wherein the basic structure units are arranged in a m×n matrix, wherein m and n are respectively positive integers greater than or equal to 2.

16. The resonator according to claim 1, wherein the resonating body is a circular or annular body.

17. The resonator according to claim 1, wherein the resonating body is a square or rectangular body.

18. The resonator according to claim 1, wherein the resonating body and the periodic structure comprise the same material.

19. The resonator according to claim 18, wherein the resonating body and the periodic structure are integrally formed.

20. The resonator according to claim 1, wherein the resonating body, the support beam and the periodic structure comprise the same material.

21. The resonator according to claim 1, comprising two periodic structures respectively connected to two ends of the resonating body.

22. The resonator according to claim 21, wherein the two periodic structures are symmetrical.

23. The resonator according to claim 1, further comprising an anchor disposed below the other end of the periodic structure and on a substrate so that each of the resonating body and the periodic structure is separated from the substrate by a distance.

24. The resonator according to claim 1, wherein the basic structure unit of the periodic structure has a plurality of holes, and the holes are filled with a substance different from a material of the basic structure unit.

25. The resonator according to claim 24, wherein the holes are filled with air.

26. The resonator according to claim 24, wherein the material of the basic structure unit comprises silicon, and the holes are filled with tungsten.

27. A periodic structure manufactured using Micro-Electro-Mechanical-System (MEMS) manufacturing processes, the structure comprising only:
a one-dimensional periodic structure body comprising one or plural basic structure units in a one-dimensional direction arrangement, wherein each of the basic structure units is acquired from a plate-like structure having two-dimensional lattice periodic holes, and the basic structure units are repeatedly arranged in the one-dimensional direction to constitute the one-dimensional periodic structure body, and the basic structure unit is acquired from an area that four orthogonal geometric scribing lines enclose on the plate-like structure having the two-dimensional lattice periodic holes, and the geometric scribing lines pass through the contours of the periodic holes.

28. The periodic structure according to claim 27, wherein the basic structure unit acquired from the plate-like structure having the two-dimensional lattice periodic holes has a band gap or deaf band characteristic when being periodically infinitely arranged so that an elastic wave transferred from one end of the periodic structure cannot propagate to the other end of the periodic structure.

29. The periodic structure according to claim 27, wherein the two-dimensional lattice periodic holes are two-dimensional square lattice holes.

30. The periodic structure according to claim 27, wherein the two-dimensional lattice periodic holes are two-dimensional triangular lattice holes.

31. The periodic structure according to claim 27, wherein the two-dimensional lattice periodic holes are two-dimensional hexagonal lattice holes.

32. The periodic structure according to claim 27, wherein each of the two-dimensional lattice periodic holes of the plate-like structure has a circular cross section, an elliptic cross section or a polygonal cross section.

33. The periodic structure according to claim 27, wherein the two-dimensional lattice periodic holes are filled with a substance different from a material of the plate-like structure.

34. The periodic structure according to claim 33, wherein the two-dimensional lattice periodic holes are filled with air.

35. The periodic structure according to claim 33, wherein the two-dimensional lattice periodic holes are filled with tungsten.

* * * * *